United States Patent
Liu et al.

(10) Patent No.: US 6,842,027 B2
(45) Date of Patent: Jan. 11, 2005

(54) METHOD AND APPARATUS FOR DETECTION AND QUANTIFICATION OF ON-DIE VOLTAGE NOISE IN MICROCIRCUITS

(75) Inventors: Jonathan H. Liu, Folsom, CA (US); Wonjae L. Kang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/265,115

(22) Filed: Oct. 7, 2002

(65) Prior Publication Data

US 2004/0066208 A1 Apr. 8, 2004

(51) Int. Cl.[7] .............................................. G01R 31/26
(52) U.S. Cl. ................................... 324/763; 324/158.1
(58) Field of Search ............................. 324/73.1, 158.1, 324/763–765, 63, 769; 714/724–733; 326/26–30, 80–87; 327/1, 58

(56) References Cited

U.S. PATENT DOCUMENTS

| | | | | |
|---|---|---|---|---|
| 5,103,118 A | * | 4/1992 | Peterson | 326/27 |
| 5,291,073 A | * | 3/1994 | Lewandowski | 327/512 |
| 5,517,130 A | * | 5/1996 | Sandhu | 326/27 |
| 5,589,782 A | * | 12/1996 | Sharpe-Geisler | 326/38 |
| 6,286,117 B1 | * | 9/2001 | Yun et al. | 714/724 |

* cited by examiner

*Primary Examiner*—Vinh P. Nguyen
(74) *Attorney, Agent, or Firm*—Blakely, Sokoloff, Taylor & Zafman LLP

(57) ABSTRACT

An on-die noise detection circuit includes one or more voltage noise sensors, and one or more associated comparators. The voltage noise sensor includes a circuit including devices designed to position an initial voltage level of nodes between the devices at certain levels. The nodes are paired where the initial level of one node is above the initial level of the other node in the pair. The devices are designed to position the initial voltage levels of nodes of each pair such that the occurrence of noise above a predefined threshold voltage causes at least one of the voltage levels at the pair of nodes to approach and pass the other. The comparator monitors the voltage levels of each pair of nodes and generates a trigger signal upon detection of the voltage levels at a pair of nodes passing each other.

15 Claims, 8 Drawing Sheets

METHOD AND APPARATUS FOR DETECTION AND QUANTIFICATION OF ON-DIE VOLTAGE NOISE IN MICROCIRCUITS

BACKGROUND

1. Field

This invention relates to noise detection, and more specifically to noise detection in microcircuits.

2. Background

In the design of microcircuits, the power delivery system and any associated power supply noise are key factors. Noise can introduce marginal functional problems with the operation of the microcircuit. These problems may only surface if certain patterns or programs are being processed by the microcircuit. Unfortunately, many times noise may not be visible at the input/output (I/O) pins of the microcircuit. Further, probing these pins to detect noise may affect the actual noise measured at the pins. Moreover, if the microcircuit is installed in a system, it may be extremely difficult to probe.

In some cases, to identify a suspected noise problem, the microcircuit is opened up and the existing die probed using a pico-probe to detect on-die voltage noise. However, on-die differential probing is extremely difficult, productivity is low, and there is no guarantee of getting results.

Therefore, there is a need for detection of on-die voltage noise in microcircuits that allows easy identification and quantification of potential in-system device power droop/ noise problems.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
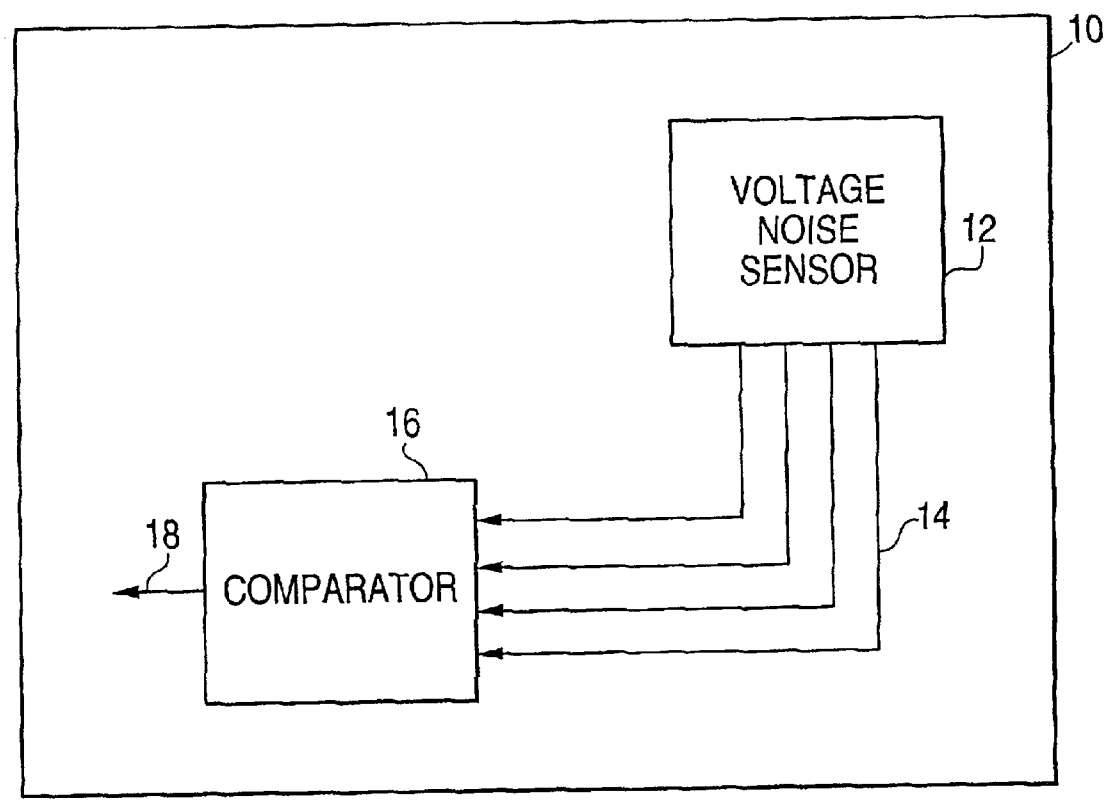
FIG. 1 is a block diagram of a microcircuit with on-die voltage noise detection according to an example embodiment of the present invention.

FIG. 1 shows a block diagram of a microcircuit with on-die voltage noise detection according to an example embodiment of the present invention. Microcircuit 10 may include one or more voltage noise sensors 12 connected to one or more comparators 16. A voltage noise sensor 12 and a comparator 16 make up a voltage noise detector cell (VND). Noise sensor 12 may monitor the power supply (Vcc) voltage level and the ground (Vss) voltage level to detect differences or changes between the two levels. Voltage noise sensor 12 may detect a maximum noise level (overshoot) and a minimum noise level (undershoot), and relay information regarding this via signal lines 14 to comparator 16. Comparator 16 compares the signals 14 received from voltage noise senor 12 and determines if noise detected has exceeded a predetermined threshold and if so, a triggering signal 18 may be generated by comparator 16.

Since the voltage noise sensor 12 and comparator 16 are on a die of microcircuit 10, a separate quiet analog power supply to provide a reference is not required. Further, a VND or array of VNDs according to the present invention may be easily dropped into a microcircuit design for late stage product implementations. No special custom routing and placement requirements are needed. Further, a VND/ comparator design according to the present invention may be process dependent instead of product dependent, therefore the present invention may be a component in the standard library of a process for any product to use.

Figure 2:
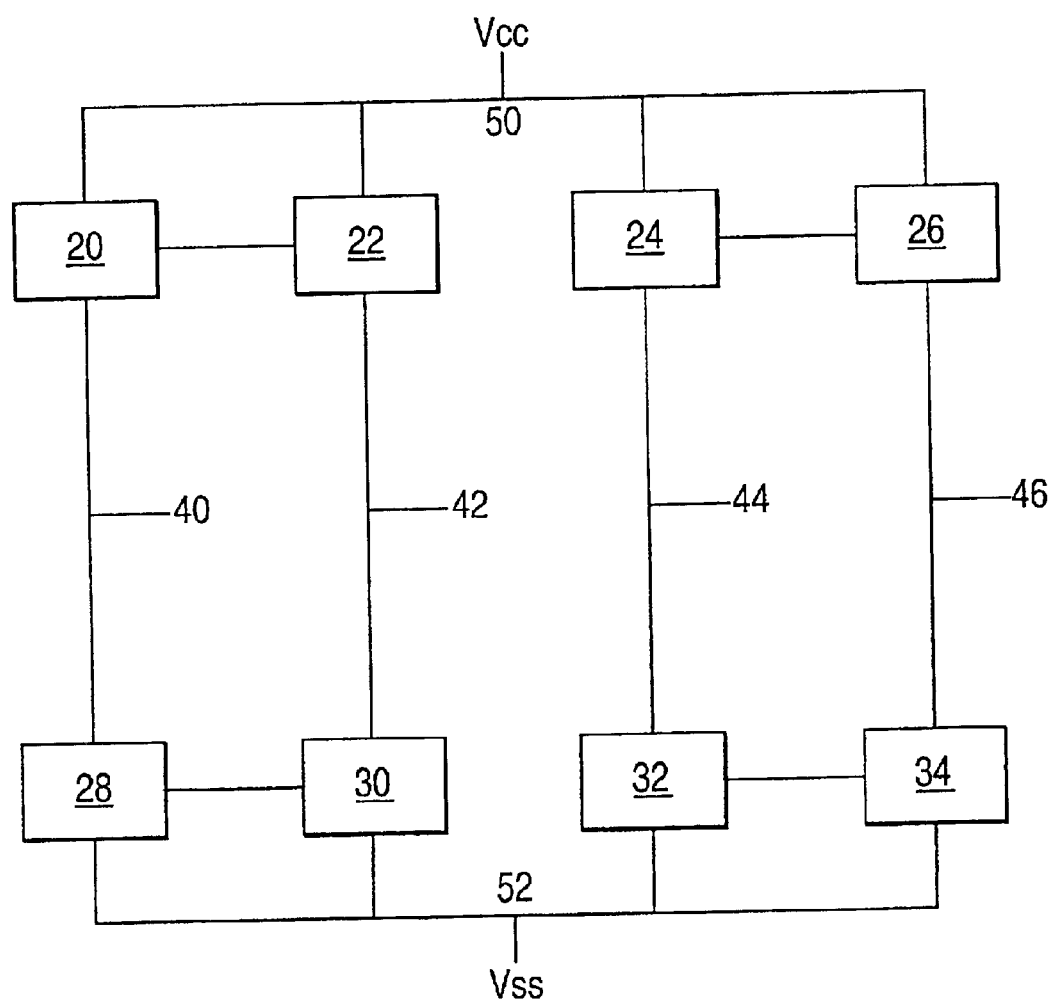
FIG. 2 is a block diagram of a voltage noise detector cell according to an example embodiment of the present invention.

FIG. 2 shows a block diagram of a voltage noise detector cell according to an example embodiment of the present invention. This cell may be connected between power source 50 and a ground source 52 of a microcircuit directly as shown in FIG. 2, or through optional transistors. The optional transistors may connect node 50 to VCC or node 52 to VSS. These optional transistors, when switched off, may prevent current flow through voltage noise sensor 12, to reduce power. Transistors or switching devices 20, 22, 24 and 26 may be connected between power source 50 and another transistor or switching device 28, 30, 32 and 34. The transistor/switching devices 28, 30, 32 and 34 may be connected to the ground source 52. Devices 20 and 22 may be identical and may be interconnected. Similarly, devices 24 and 26 may be identical and connected, devices 28 and 30 may be identical and connected, and devices 32 and 34 may also be identical and inter-connected.

A node 40 (Vssup) may be defined between the connection of devices 20 and 28. Similarly, a node 42 (Vccup) may be defined between the connection of devices 22 and 30, a node 44 (Vssdn) may be defined between the connection of devices 24 and 32 and a node 46 (Vccdn) may be defined between the connection of devices 26 and 34. Devices 20, 22, 24 and 26 may be a different type device than devices 28, 30, 32 and 34. For example, devices 20, 22, 24 and 26 may be PMOS type devices, whereas devices 28, 30, 32 and 34 may be NMOS type devices. The transistor/switching devices 20, 22, 24, 26, 28, 30, 32 and 34 may be biased in deep saturation region, therefore, the current may be independent of power level.

The node 40 (Vssup) may connect to the gates of devices 28 and 30, and node 42 (Vccup) may connect to the gates of devices 20 and 22. Similarly, node 44 (Vssdn) may connect to the gates of devices 32 and 34, and node 46 (Vccdn) may connect to the gates of devices 24 and 26.

The voltage noise detector cell may be designed such that nodes Vccdn 46 and Vccup 40 follow the movement of the power source voltage level 50. Further, the node Vssup 42 and node Vssdn 44 may follow the movement of the ground voltage level 52. By following the movement of the power (Vcc) and the ground (Vss), the current of the voltage noise sensor may be maintained at a constant level.

An apparatus for detection of on-die voltage noise according to the present invention may be designed with device sizes and interconnections between the devices such that the voltage level at the Vssup node 40, Vccup node 42, Vssdn node 44, and Vccdn node 46 are at certain levels relative to another. Specifically, a VND cell may be designed such that the voltage level of the Vccup node 40 is below the voltage level of the Vssdn node 42. Thus, when positive noise is detected (Vcc-Vss), the voltage level of the Vccup node 42 goes above that of the voltage level at the Vssdn node 44, thereby causing the comparator to generate a trigger. Similarly, the VND cell may be designed so the voltage level of the Vssup node 40 is below the voltage level of the Vccdn node 46. Therefore, when negative noise is detected (Vcc-Vss) the voltage level at the Vccdn node 46 goes below that of the voltage level at Vssup node 40, thus causing the comparator to generate a trigger. Therefore, according to the present invention, a voltage noise detector cell may detect a maximum overshoot noise and a minimum undershoot noise.

A voltage noise detector cell according to the present invention may be disabled when noise detection is not desired, thus saving power, and enabled when noise detection is desired. Further, the voltage noise detection cell is not sensitive to process, voltage, or temperature variations and does not measure direct current (DC) voltage differential. Thus the Vccup node 42 and the Vssdn node 44 may be used for maximum (Vcc-Vss) node noise detection, and the Vccdn node 46 and the Vssup node 40 used for minimum (Vcc-Vss) noise detection.

Moreover, although eight transistors/switching devices are used in this example embodiment, the present invention is not limited by this number of devices, and any number of devices may be used, less than or more than eight, and still be within the spirit and scope of the present invention. Further, although four nodes have been defined in this example embodiment, the present invention is not limited by the use of four nodes and any number of nodes may be defined to implement the present invention.

Figure 3:
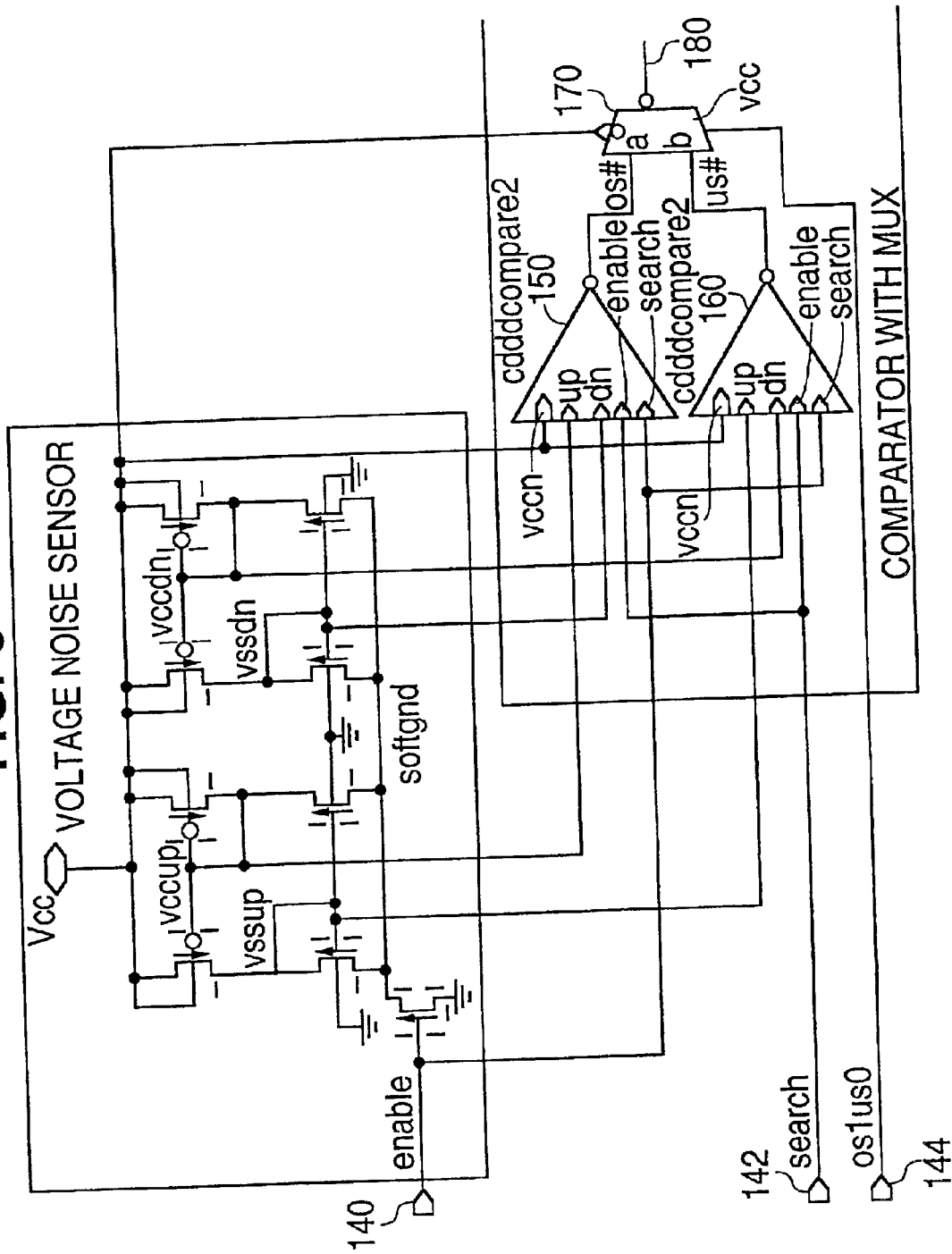
FIG. 3 is a voltage noise detector circuit according to an example embodiment of the present invention.

FIG. 3 shows a voltage noise detector circuit according to an example embodiment of the present invention. In this example embodiment, a voltage noise sensor is composed of eight transistor devices where four transistor devices are PMOS devices and four transistor devices are NMOS devices. The transistor devices may be specifically sized to obtain specific voltage levels at the Vssup node, Vccup node, Vssdn node, and Vccdn node based on the desired noise threshold to be detected by this voltage noise detector cell. The top left two transistor devices may be identical, the top right two transistor devices may be identical, the bottom left two transistor devices may be identical and the two bottom right transistor devices may be identical.

An input enable signal 140 may be used to enable the voltage noise detector. An input search signal 142 may enable a latch inside the comparator to lock the detection signal. This voltage noise detector cell may be used to accurately capture overshoot and undershoot noise, and has no input or reference. An os1us0 signal 144 may be used for controlling which detection result is output. For example, when the os1us1 signal is at a high level, an overshoot detection result may be sent out, whereas when the os1us1 signal is at a low level, an undershoot detection result may be sent out. According to the present invention, overshoot and undershoot noises may be detected at the same time. In this example embodiment, two comparators 150, 160 are used, one for overshoot detection 150 and one for undershoot detection 160. A multiplexer 170 may be used to select between passing the overshoot detection result os# or the undershoot detection result us# to the trigger output signal 180.

The comparator may be shared by multiple voltage noise sensors with proper design changes. Moreover, each voltage noise detector cell may be modified or designed to be able to support multiple noise threshold level detection.

Figure 4A:
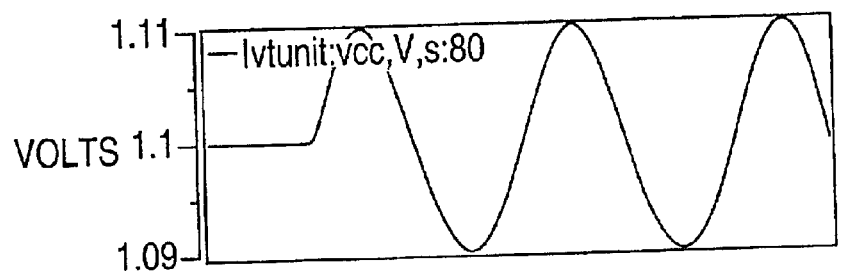
FIGS. 4A–D are graphical illustrations of maximum noise detection according to an example embodiment of the present invention.
Figure 4B:
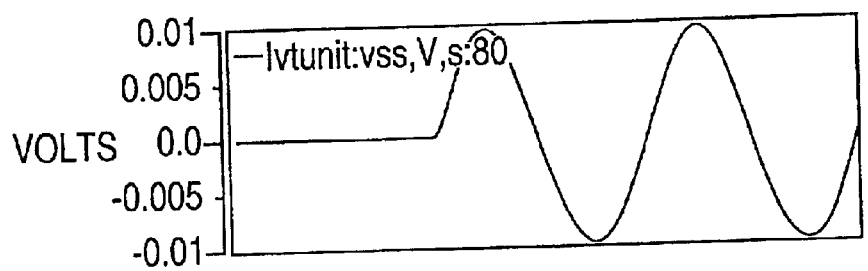
Figure 4C:
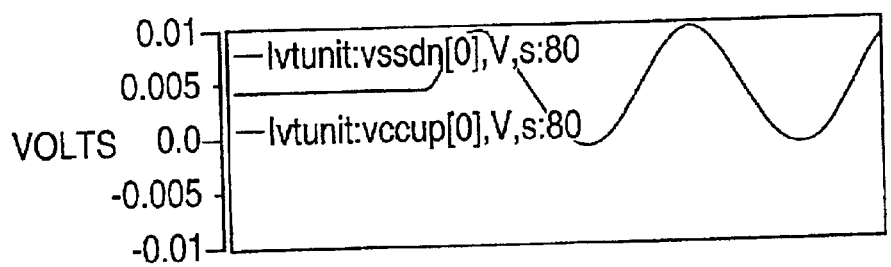
Figure 4D:
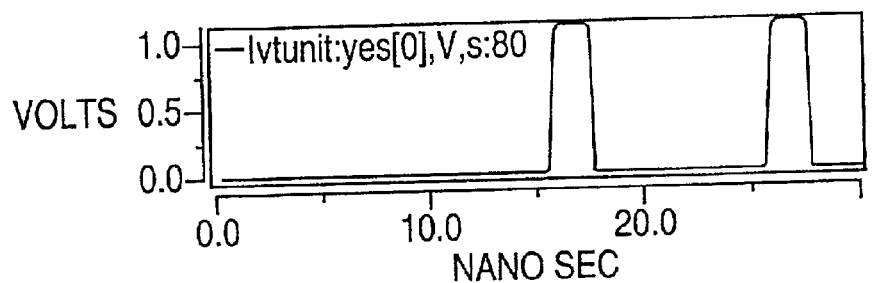

FIGS. 4A–D show graphical illustrations of maximum noise detection according to an example embodiment of the present invention. FIG. 4A shows a graph of a 20 mv. peak-to-peak noise sine wave added to Vcc at 1.1 volt. FIG. 4B shows a 20 mv. peak-to-peak noise sine wave added to Vss at 0 volts. In this example embodiment, the noise on Vcc and Vss are 180° out of phase. The top graph in FIG. 4C shows the voltage at the Vssdn node, and the bottom graph in FIG. 4C shows the voltage level at the Vccup node. FIG. 4C illustrates how the voltage level movements at the Vccup node are dominated by voltage level changes in Vcc, and how the voltage level movements at the Vssdn node is dominated by voltage level changes of Vss. When the voltage level of the Vccup node goes above the voltage level of the Vssdn node, this signifies that the voltage noise threshold level that the voltage noise detection cell was designed for has been reached. The points where the voltage level of Vssdn and the voltage level of Vccup overlap are where the voltage noise threshold has been reached or exceeded. A comparator monitors these voltage levels at the Vssdn and Vccup nodes and when overlap is detected, the comparator to generates a trigger, shown in FIG. 4D. A trigger being generated by the comparator signifies that noise has been detected at or above the threshold that the voltage noise detection cell was designed to detect.

Therefore, by inserting different amounts of voltage differential between the Vssdn node and the Vccup node, the voltage noise detection cell triggers at different amounts of positive (Vcc-Vss) noise accordingly, in this case, +20 mv.

Figure 5A:
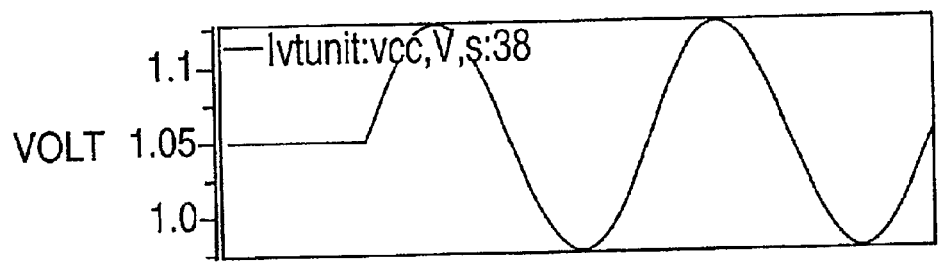
FIGS. 5A–D are graphical illustrations of minimum noise detection according to an example embodiment of the present invention.

FIGS. 5A–D show graphical illustrations of minimum noise detection according to an example embodiment of the present invention. FIG. 5A shows a graph of a 160 mv. peak-to-peak noise sine wave added to Vcc at 1.05 volts.

Figure 5B:
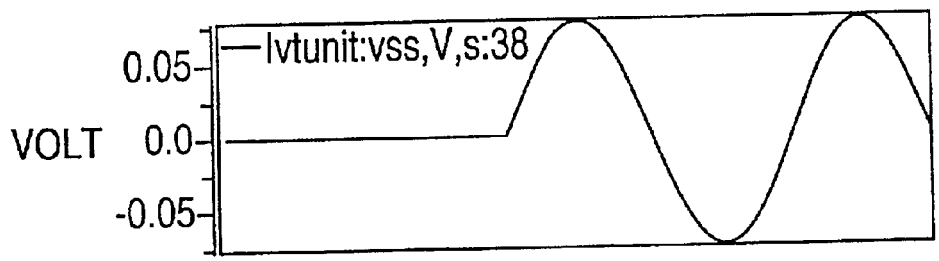
Figure 5C:
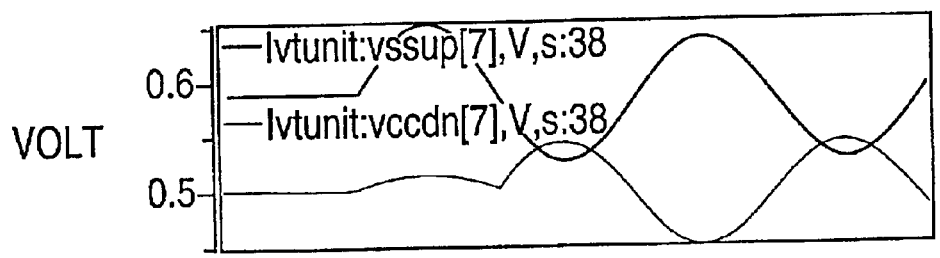
Figure 5D:
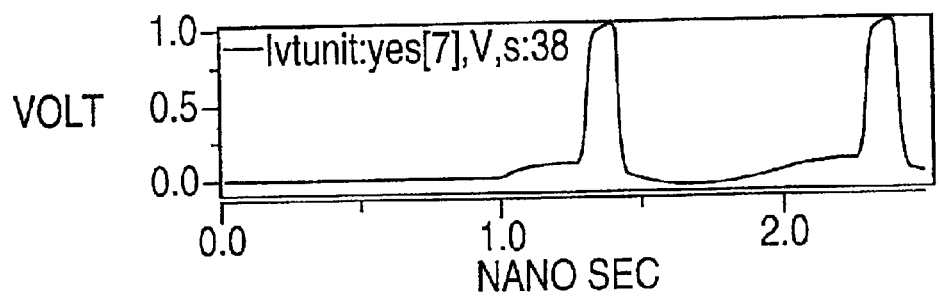

FIG. 5B shows a graph of a 160 mv. peak-to-peak sine wave added to Vss at 0 volts. In this example embodiment, the noise on Vcc and Vss are 180° out of phase. In FIG. 5C, the top graph shows the voltage level at the Vssup node and the bottom graph shows the voltage level at the Vccdn node. FIG. 5C illustrates how the voltage level at the Vccdn node follows changes in the voltage level of Vcc, and how the voltage level at the Vssup node follows changes in the voltage level of Vss. A comparator monitors the voltage levels at the Vccdn node and the Vssup node, and when the voltage level at the Vccdn node goes below the voltage level at the Vssup node, the comparator generates a trigger as shown in FIG. 5D. Therefore, according to the present invention, by inserting different amounts of voltage differential between the Vssup node and the Vccdn node, a voltage noise detection cell may trigger at different amounts of negative (Vcc-Vss) noise, in this case, −160 mv.

Figure 6:
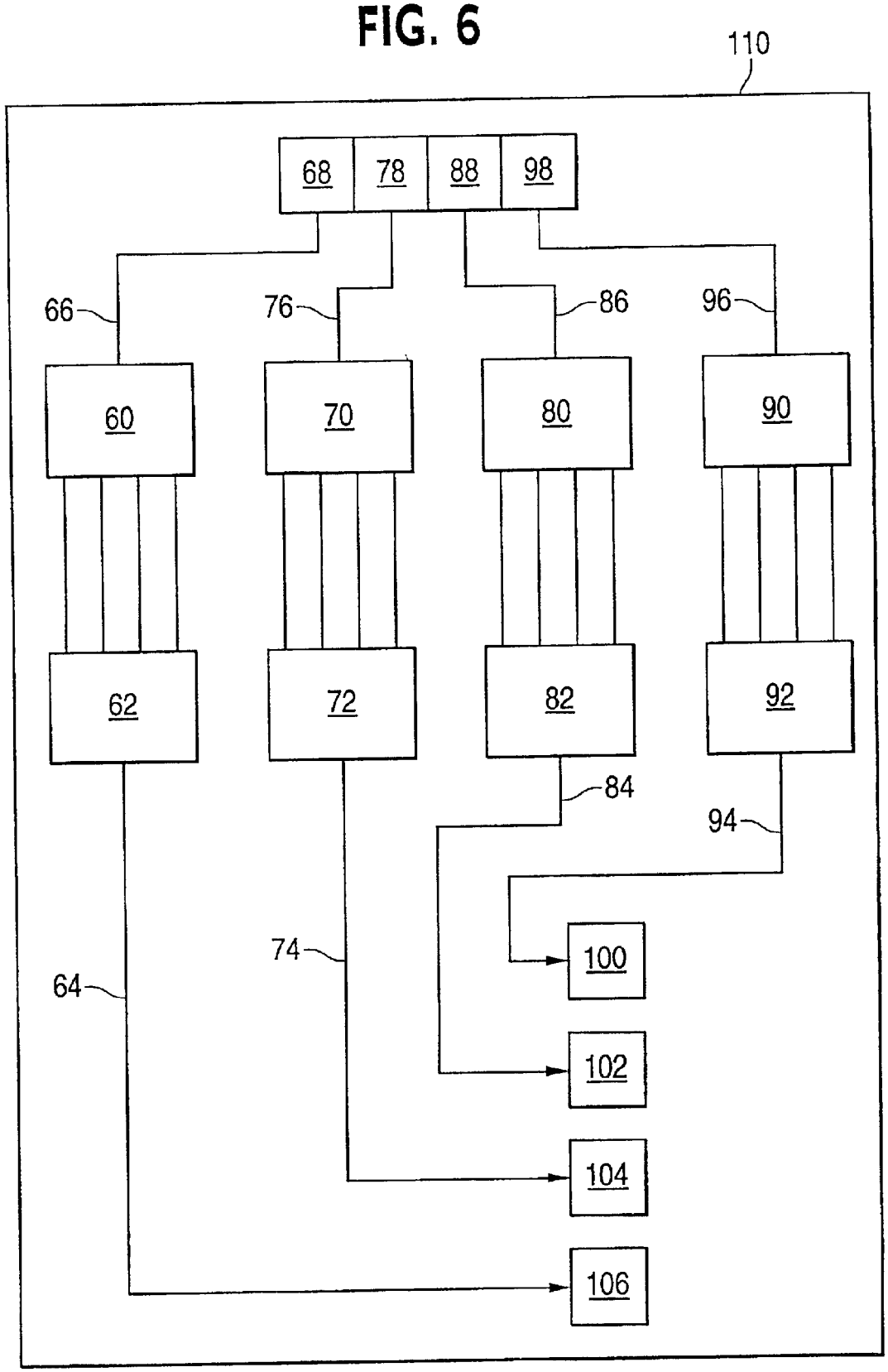
FIG. 6 is a block diagram of a microcircuit with multiple voltage noise detection cells according to an example embodiment of the present invention.

FIG. 6 shows a block diagram of a microcircuit with multiple voltage noise detection cells according to an example embodiment of the present invention. A microcircuit 110 according to the present invention may include an array of voltage level noise detection cells 60, 70, 80 and 90 interconnected to multiple comparators 62, 72, 82 and 92, respectively. Each voltage noise detector cell may be designed to detect the occurrence of voltage noise at or above a specific threshold level. For example, the voltage noise detector cell 60 may be designed to detect any noise above 200 mv, the voltage noise detector cell 70 designed to detect any noise above 220 mv, the voltage noise detector cell 80 designed to detect any noise above 240 mv and the voltage noise detector cell 90 designed to detect any noise above 260 mv. Each voltage noise detector noise cell 60, 70, 80 and 90 may be individually enabled by setting a bit in a register 68, 78, 88 and 98, respectively. These enable registers 68, 78, 88 and 98 may be controlled or written to by devices external to microcircuit 110 thereby allowing the enabling of voltage noise detection of either 200 mv, 220 mv, 240 mv, 260 mv or a combination thereof. The enable signals 66, 76, 86, 96 are sent from registers 68, 78, 88 and 98 to the individual voltage noise detection cells 60, 70, 80 and 90, respectively. The enable signals 66, 76, 86, 96 may also be the same enable signal.

Each comparator 62, 72, 82 and 92 may send any generated trigger signal 64, 74, 84 and 94, respectively, to a register to be stored. Therefore, if voltage noise is detected above 200 mv, a trigger 64 may be generated by comparator 62 and stored in register 106. Similarly, a trigger 74 generated by comparator 72 for noise detected above 220 mv may be stored in register 104, a trigger 84 generated by comparator 82 for noise detected above 240 mv may be stored in register 102, and a trigger 94 generated by comparator 92 for noise detected above 260 mv may be stored in register 100.

The registers 100, 102, 104 and 106 that store the triggers may be accessible external to microcircuit 110, thereby allowing reading of any detected voltage level noise at the various threshold levels. Further, each noise detector cell may be disabled, and the registers 100, 102, 104, 106 reset to allow a new monitoring and new detection of voltage level noise. Although an array of four voltage noise detector cell combinations are shown in this example embodiment, the present invention is not limited by this number and less or more voltage noise detection cells may be used to implement the present invention. Further, each voltage noise detection cell may be located in the same area or different areas of microcircuit 110 thereby allowing voltage noise detection throughout the circuitry on microcircuit 110.

Figure 7:
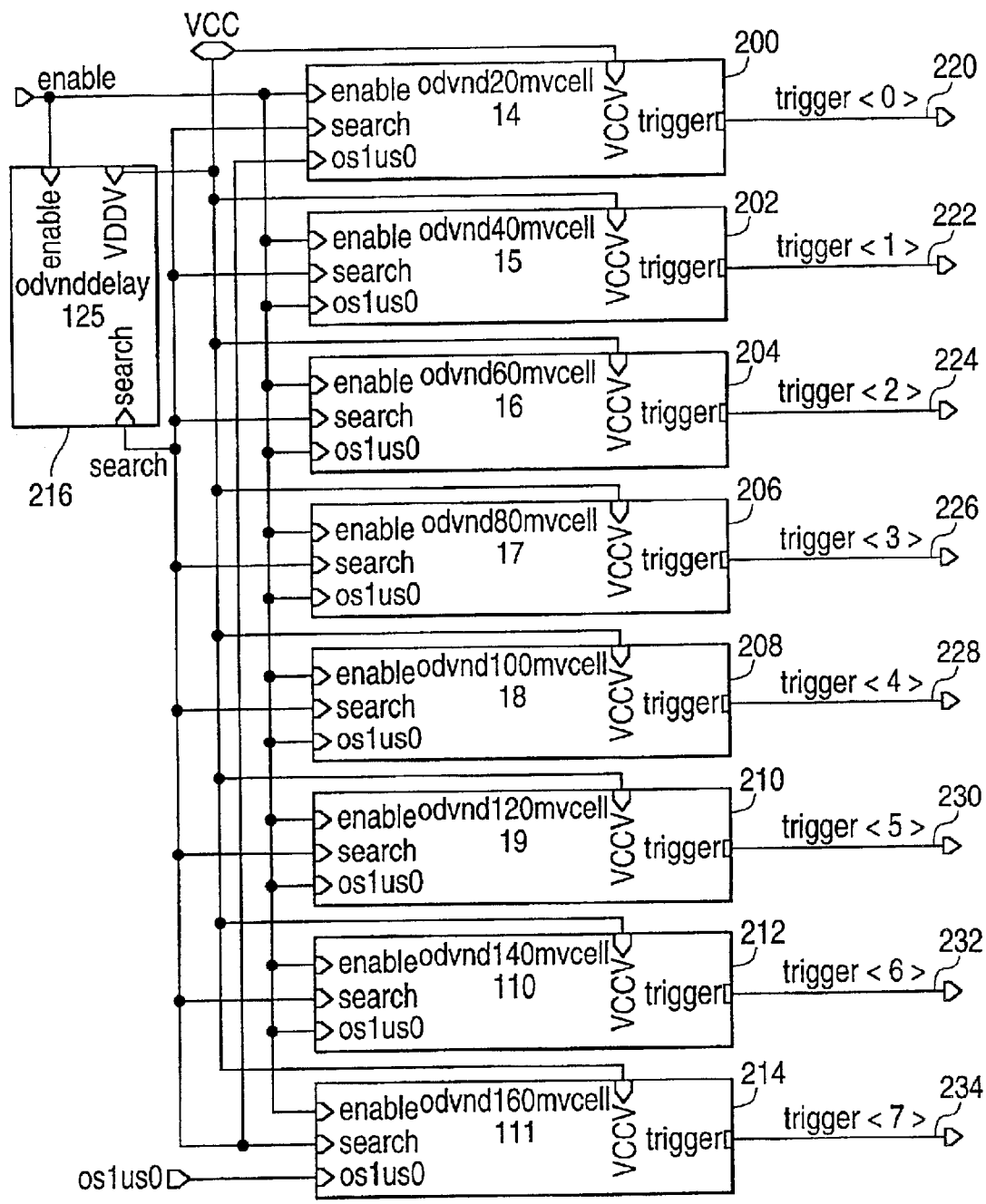
FIG. 7 is a diagram of an array of voltage noise detection cells according to an example embodiment of the present invention.

FIG. 7 shows a diagram of an array of voltage noise detection cells according to an example embodiment of the present invention. In this figure, blocks 200–214 are shown representing an array of eight voltage noise detection cells (VNDs). A delay circuit 216 may also be connected to the array of voltage noise detection cells and used to generate a search signal from an enable signal, discussed previously regarding FIG. 3. The amount of delay may be set to insure that the noise sensors are fully initialized, before the detection signal is latched, to avoid false trigger.

Each voltage noise detection cell 200–214 produces a trigger output signal 220–234, respectively, when that VND detects voltage noise above the threshold level that the VND was designed for. The trigger output signal 220–234 may be designed to be either a pulse (as shown in the example embodiments of FIGS. 4D and 5D), or to be an active edge trigger latched and maintained signal. The trigger output signals 220–234 may be used as inputs to counters to allow the recording of the number of each VND trigger within a time period. This allows an on-die noise histogram to be obtained for circuit activities and software induced noise analysis.

This array of voltage noise detection cells with trigger points tuned at different noise levels may be dropped into or implemented in any die to allow voltage droop detection. An array of voltage noise detection cells (or individual voltage noise detection cells) may be placed on the same die of a microcircuit at different locations. This allows a noise profile or map of the die to be obtained. This information may be very useful for circuit power noise decoupling design. In this example embodiment, the array of voltage noise detection cells may be designed to detect, for example, voltage overshoot of 20 mv to 160 mv, and voltage undershoot of 60 mv to 180 mv.

Figure 8:
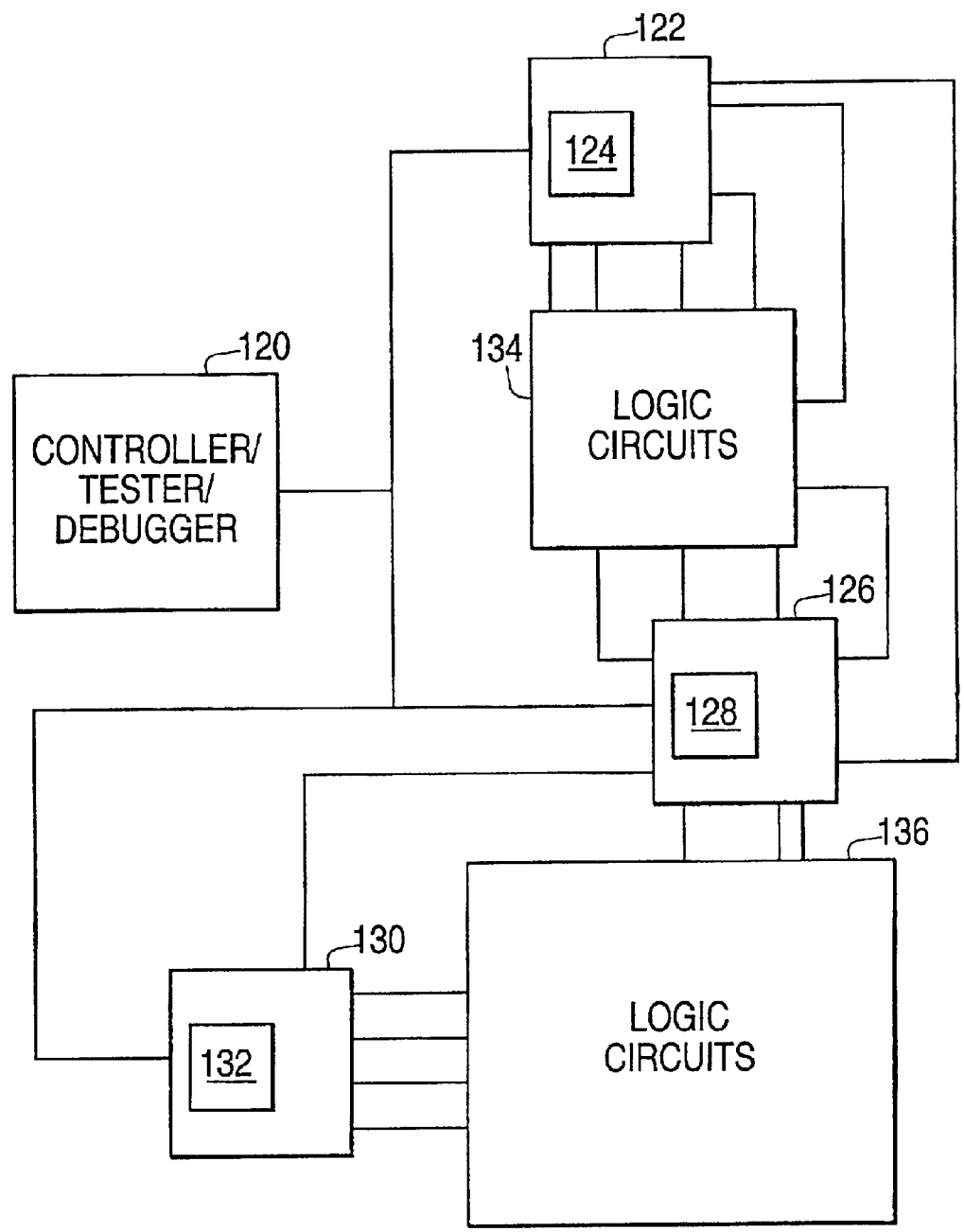
FIG. 8 is a block diagram of a system for on-die voltage noise detection according to example embodiment of the present invention.

FIG. 8 shows a block diagram of a system for on-die voltage noise detection according to example embodiment of the present invention. One or more microcircuits 122, 126 and 130 may be interconnected in a system with other logic circuits and/or devices 134, 136. Each microcircuit 122, 126, 130 may include on-die voltage noise detection logic 124, 128 and 132, respectively. Another device 120 in the system may be used to enable voltage noise detection logic 124, 128 and 132 thereby allowing monitoring and detection of voltage level noise on each of microcircuits 122, 126, 132, respectively. The device 120 may be a controller, a processor, a tester, or a debugger type device used for the purpose of noise monitoring, or handling the monitoring of noise on microcircuits as one of its tasks or functions in the system. Therefore, voltage level noise may be monitored and detected in real-time on each of microcircuits 122, 126 and 130 without the microcircuit being probed, or disconnected from the system. Further, this allows voltage level noise to be monitored and detected during real operation of the microcircuits 122, 126 and 130, as well as specific patterns or applications run to determine their effect on voltage level noise in each of the microcircuits. Microcircuits 122, 126 and 130 may also be different circuits or functional blocks on the same die. Moreover, microcircuits 122, 126 and 130 may have different power sources.

Apparatus for detection of on-die voltage noise in microcircuits is advantageous for a number of reasons. For example, the present invention solves the problem of the current inability to micro-probe/pico-probe in-system product on die (Vcc-Vss) differentials to form the on die AC (alternating current) voltage noise profile for in-system product power delivery design verification. The present invention solves the current problem of the inability to verify device voltage stress distribution in various systems for detailed reliability risk assessment; resulting in poor optimization between product reliability risks and performance. Further, the current problem of inability to correlate performances, such as speed paths and clock jitters, to the magnitudes of global and localize voltage noise is solved, as well as the problem of the current inability to verify the effectiveness of various di/dt vector programs, such as the worst SSO vectors, to accelerate product validation.

Moreover, apparatus for detection of on-die voltage noise in microcircuits is advantageous in that the present invention is highly accurate and it's performance is independent of process, voltage, or temperature, to avoid tedious calibrations and the use of fuse cells. Further, apparatus for detection of on-die voltage noise and microcircuits according to the present invention have wide frequency range and are capable of catching high frequency AC noise at the core clock frequency range. Moreover, the present invention may be easily dropped in to a die for late stage product implementation, and does not require a separate quiet analog power supply to provide a reference. Further, the present invention requires no special custom routing or placement. The present invention may be a self-contained circuit that can be dropped in any vacancy without additional layout effort. The design of circuitry according to the present invention is process dependent instead of product dependent. Therefore, it may be a component in a standard library of a process for any product to use. Additionally, although the present invention has been illustrated as being on-die of a microcircuit, voltage noise detection using the present invention may be applied to devices and circuitry that are not on a die of a device.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. An apparatus comprising:
    a voltage noise sensor including first transistors coupled to a first node to have a first voltage and second transistors coupled to a second node to have a second voltage, the first and second transistors coupled to apply different initial voltages to the first and second nodes, respectively, wherein noise exceeding a threshold value causes the first and second voltages to pass each other; and
    a comparator coupled to the first and second nodes to monitor the first and second voltages and to generate a trigger signal upon detection of the first and second voltages passing each other.

2. The apparatus according to claim 1, wherein the first and second nodes comprise a first pair of nodes, and wherein the voltage noise sensor further includes a second pair of nodes, one node in each of the first and second pair of nodes is coupled to follow movement of a Vcc voltage level and the other node in each of the first and second pair of nodes is coupled to follow movement of a Vss voltage level.

3. The apparatus according to claim 2, wherein the first and second pair of nodes comprise a Vccup node coupled to follow increases in the Vcc voltage level, a Vccdn node coupled to follow decreases in the Vcc voltage level, a Vssup node coupled to follow increases in the Vcc voltage level, and a Vssdn node coupled to follow decreases in the Vss voltage level.

4. The apparatus according to claim 3, wherein the Vccdn node is paired with the Vssup node and the Vssdn node is paired with the Vccup node, the initial voltage level of the Vccdn node being above the initial voltage level of the Vssup node, and the initial voltage level of the Vssdn node being above the initial voltage level of the Vccup node.

5. The apparatus according to claim 1, further comprising eight transistors.

6. The apparatus according to claim 1, further comprising a register, the register being set by the comparator once the trigger is generated.

7. The apparatus according to claim 6, wherein the apparatus comprises a microcircuit and the register is readable by devices external to the microcircuit.

8. The apparatus according to claim 1, further comprising a register, the register being used to one of enable and disable the detector.

9. The apparatus according to claim 8, wherein the apparatus comprises a microcircuit and the register is accessible by sources external to the microcircuit.

10. The apparatus according to claim 1, wherein each voltage noise sensor further comprises eight transistors.

11. The apparatus according to claim 1, wherein the voltage noise sensor and the comparator comprise a voltage noise detection (VND) cell, at least one VND cell being easily inserted into a microcircuit design.

12. The apparatus according to claim 1, wherein the apparatus comprises a processor.

13. The apparatus according to claim 8, wherein the voltage noise sensor and the comparator comprise a voltage noise detection (VND) cell, the processor comprising multiple VND cells placed at different locations on a die of the processor to detect noise at the different locations.

14. The apparatus of claim 1, wherein the apparatus comprises a noise detection circuit integrated onto a die, the noise detection circuit further comprising:
    a plurality of the voltage noise sensor disposed on the die;
    a plurality of the comparator disposed on the die, each comparator associated with one of the plurality of the noise sensor; and
    a controller coupled to each of the plurality of the voltage noise sensor to enable and to disable each of the plurality of the voltage noise sensor, the noise detection circuit to monitor and to detect an occurrence of noise within the die exceeding the threshold value.

15. The apparatus of claim 1, further comprising a counter coupled to receive the trigger signal from the comparator and to record a number of the trigger signals within a time period.

* * * * *